United States Patent
Jang

(10) Patent No.: US 7,545,947 B2
(45) Date of Patent: Jun. 9, 2009

(54) HEARING AID USING PRINTED CIRCUIT BOARD

(75) Inventor: Soon-Suck Jang, KwangJu (KR)

(73) Assignee: Algorkorea Co., Ltd., KwangJu (KR)

( * ) Notice: Subject to any disclaimer, the term of this patent is extended or adjusted under 35 U.S.C. 154(b) by 473 days.

(21) Appl. No.: 10/574,308

(22) PCT Filed: Jun. 7, 2005

(86) PCT No.: PCT/KR2005/001697

§ 371 (c)(1),
(2), (4) Date: Apr. 3, 2006

(87) PCT Pub. No.: WO2006/001611

PCT Pub. Date: Jan. 5, 2006

(65) Prior Publication Data

US 2008/0247580 A1    Oct. 9, 2008

(30) Foreign Application Priority Data

Jun. 24, 2004   (KR) .................... 10-2004-0048723

(51) Int. Cl.
*H04R 25/00*   (2006.01)

(52) U.S. Cl. .............. 381/324; 381/322; 381/323

(58) Field of Classification Search ........... 381/312, 381/313, 314, 322, 323, 324, 325, 328, 380; 181/129, 130, 135
See application file for complete search history.

(56) References Cited

U.S. PATENT DOCUMENTS 3,598,928 A * 8/1971 Hickox .................. 381/324
4,447,677 A * 5/1984 Miyahra et al. .......... 381/324
4,890,329 A   12/1989 Erbe
5,265,168 A   11/1993 Schiess et al.
6,940,988 B1 * 9/2005 Shennib et al. .......... 381/322

FOREIGN PATENT DOCUMENTS

KR   20-1988 0001439   4/1988

* cited by examiner

*Primary Examiner*—Huyen D Le
(74) *Attorney, Agent, or Firm*—Ladas & Parry LLP

(57) ABSTRACT

A hearing aid using a printed circuit board (PCB) is provided, which minimizes internal wires since components of the hearing aid are disposed on the PCB. In the hearing aid using a PCB, hearing aid components can be automatically disposed and soldered on the PCB, and through this the total process time, including manufacturing time, can be substantially reduced.

1 Claim, 9 Drawing Sheets

HEARING AID USING PRINTED CIRCUIT BOARD

TECHNICAL FIELD

The present invention relates to a hearing aid in a medical equipment technological field, and more particularly to, a hearing aid using a printed circuit board (PCB) which minimizes internal wires since components of the hearing aid are disposed on the PCB.

BACKGROUND ART

Among the currently available hearing aids, ITE (In-The-Ear) type hearing aids which are respectively inserted into an external auditory canal are manufactured by individual soldering of volume control components such as microphones, amplifiers and receivers with elongate electric wires as shown in FIGS. 1A and 1B.

In the case of analog hearing aids which are currently available in the market, amplifier terminals are comparatively simple and thus it is not difficult to manufacture hearing aids through individual soldering.

However, in the case of digital hearing aids which are recently available in the market, amplifier terminals becomes large in numbers and complicated. That is, in the case of the digital hearing aids, approximately twenty elongate electric wires are soldered in each digital hearing aid. Accordingly, experienced soldering experts are needed. Further, in the case of ITE type hearing aids or enddrum type hearing aids which are respectively deeply inserted into an external auditory canal, part of functions of the digital hearing aid due to an increase in the number of the electric wires should be simplified.

Since the currently available analog or digital hearing aids should be manually soldered with a number of elongate wires, faceplates which are essential for manufacturing the hearing aids are manufactured in and supplied from China or East Asian countries where manpower cost is still cheap. Thus, if a method of automatically producing faceplates in a mass-production process of hearing aids is developed, a manufacturing cost of a faceplate becomes low and thus a manufacturing cost of a hearing aid becomes low, to accordingly enhance a competitive power of selling the hearing aid. Therefore, a technology of mass-producing faceplates for use in hearing aids should be needed differently from the existing hearing aid faceplate manufacturing method.

DISCLOSURE OF THE INVENTION

To solve the above problems, it is an object of the present invention to provide a hearing aid which uses a PCB (Printed Circuit Board) and thus minimizes internal wires in an ITE (In-The-Ear) type hearing aid.

It is another object of the present invention to provide a hearing aid using a PCB (Printed Circuit Board) in which the PCB is connected with the internal surface on a faceplate of an ITE (In-The-Ear) type hearing aid, which enables an automatic soldering process and reduces unnecessary soldering of internal wires to thereby enable a mass-production of the hearing aid faceplates.

To accomplish the above object of the present invention, there is provided a hearing aid comprising: a PCB (Printed Circuit Board) in which components of the hearing aid are automatically disposed and soldered; a faceplate for use in the hearing aid, and battery electrode terminals connecting two positive and negative electrodes at both sides of a battery chamber disposed at the center of the faceplate, wherein the PCB is connected with the internal surface of the hearing aid faceplate.

Preferably, an amplifier, a front microphone, a rear microphone, and a receiver are soldered in turn onto the PCB by an elongate electric wire, respectively.

Preferably, a memory diverting switch and the battery electrode terminals are soldered and connected onto the PCB circuit terminals.

Preferably, interface socket terminals between an external controller attached to the battery chamber and the amplifier chip and the PCB circuit terminals are soldered and connected onto each other by use of short electric wires.

BRIEF DESCRIPTION OF THE DRAWINGS

The above and other objects and advantages of the present invention will become more apparent by describing the preferred embodiment thereof in detail with reference to the accompanying drawings in which.

BEST MODE FOR CARRYING OUT THE INVENTION

Hereinbelow, a hearing aid using a PCB (Printed Circuit Board) according to the present invention will be described with reference to the accompanying drawings.

Figure 2A:
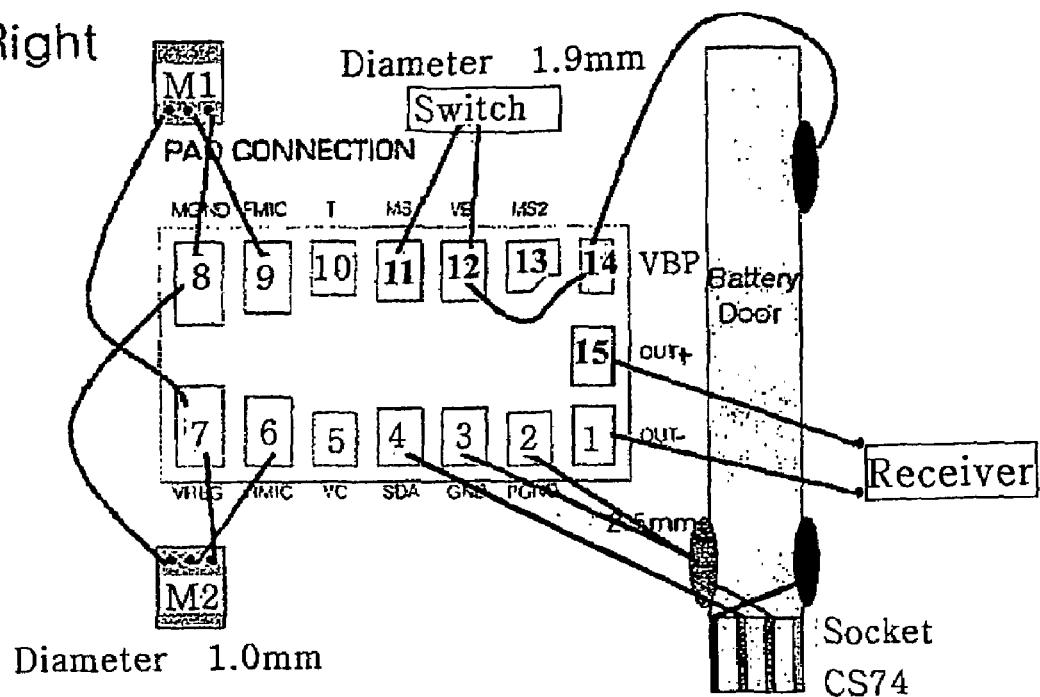
FIG. 2A shows a layout of hearing aid components in an integrated circuit (IC) chip No. GB3211 of Gennum Company in Canada.
Figure 2B:
FIG. 2B is a photograph showing the IC chip No. GB3211 of FIG. 2A.

FIG. 2A shows a layout of hearing aid components in an integrated circuit (IC) chip No. GB3211 of Gennum Company in Canada. FIG. 2B is a photograph showing the IC chip No. G33211 of FIG. 2A.

In FIG. 2A, a reference symbol M1 denotes a front microphone, and a reference symbol M2 denotes a rear microphone, each having a diameter of 2 mm. Also, a switch in FIG. 2A is a memory diverting switch, and a receiver therein is a general receiver. Also, a socket CS74 device is a connection socket for digital interface with an external controller personal computer. Also, a battery door is a hearing aid battery chamber. These components such as the front and rear microphones, the switch, the receiver, the socket and the battery chamber are connected to pad connection terminals of the IC chip on a PCB (Printed Circuit Board).

Figure 1A:
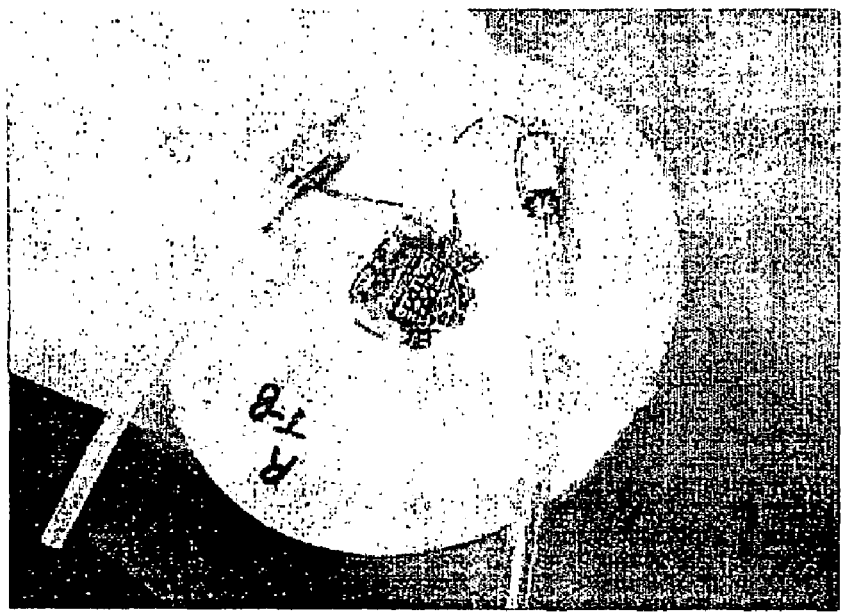
FIG. 1A is a photograph illustrating an existing digital hearing aid faceplate.
Figure 1B:
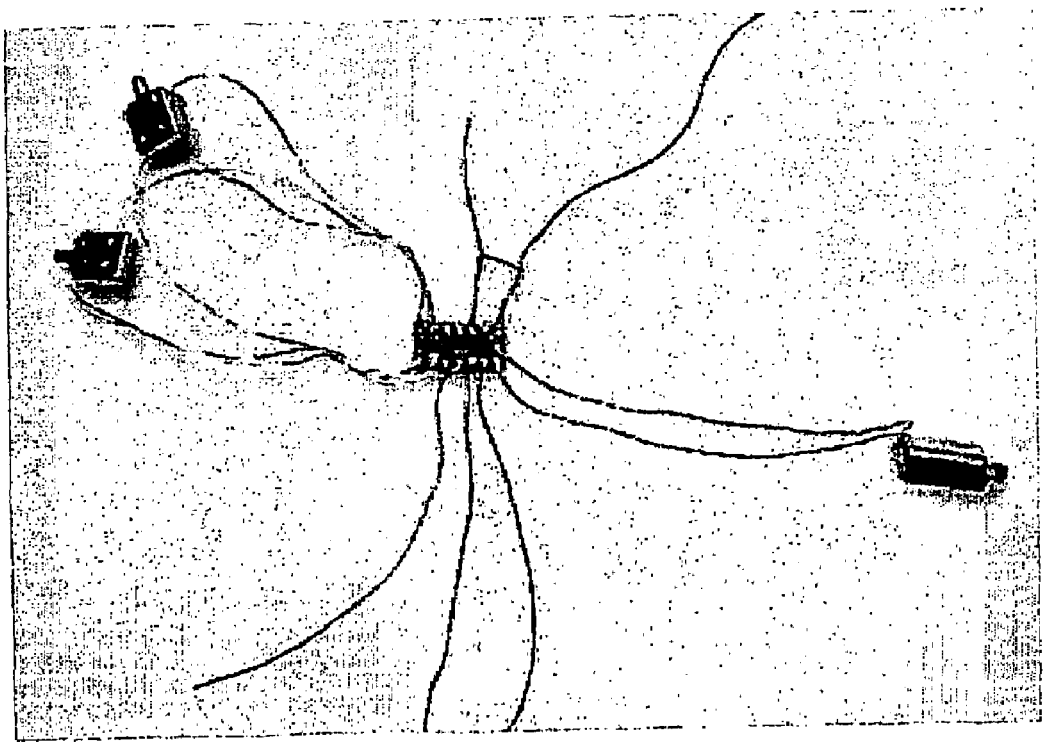
FIG. 1B is a photograph illustrating a manual soldering work for amplifier chips of the existing digital hearing aid faceplate.

As shown in FIG. 2B, the GB3211 IC chip is used for a four-channel digital hearing aid. As shown in FIGS. 1B and 2A, a number of elongate electric wires, that is, a number of twisted wires should be soldered to individual components of a digital hearing aid, in order for the GB3211 IC chip to function as the digital hearing aid.

A compact spherical battery necessary for driving a hearing aid should be vertically inserted onto the inner center of a faceplate used for the ITE (In-The-Ear) type hearing aid. Accordingly, a battery chamber occupies a large area at the center of the faceplate.

Figure 3:
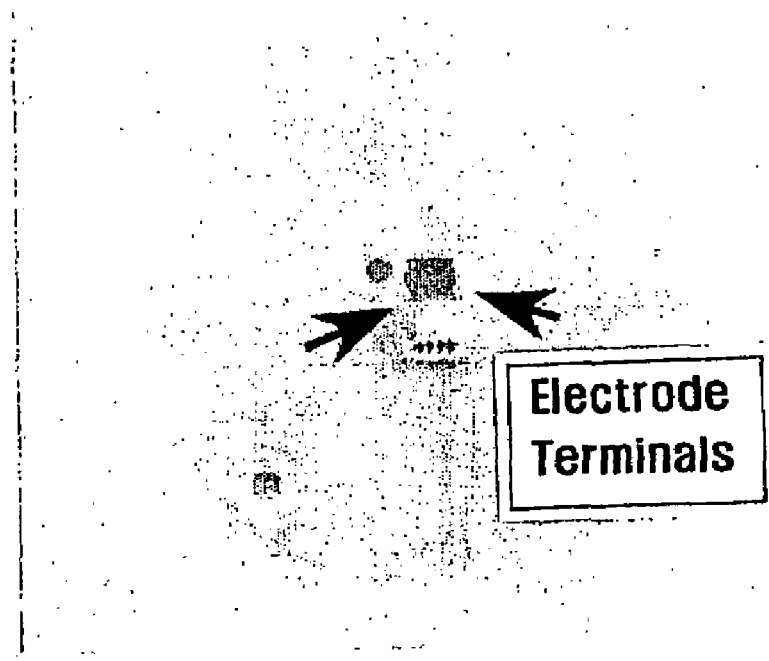
FIG. 3 is a photograph showing dry cell electrode terminals which are disposed at both sides of a battery chamber which is positioned at the center of a hearing aid faceplate.

As shown in FIG. 3, copper electrode terminals connecting two positive and negative electrodes of a battery are disposed at both sides of a battery chamber which is positioned at the center of a hearing aid faceplate.

Figure 4A:
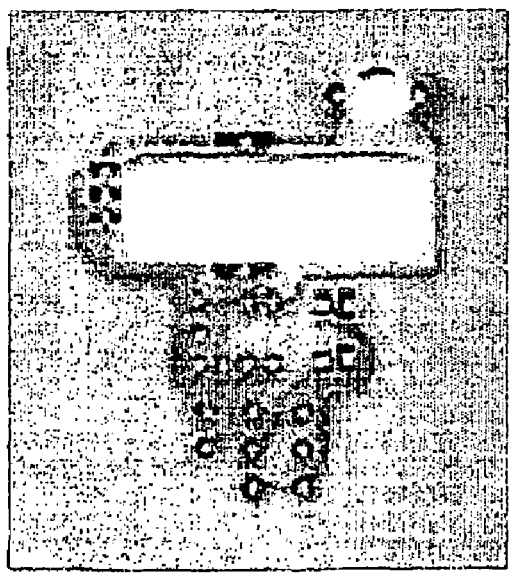
FIG. 4A is a photograph showing a first embodiment of a PCB (Printed Circuit Board) which is mounted in the digital hearing aid faceplate.
Figure 4B:
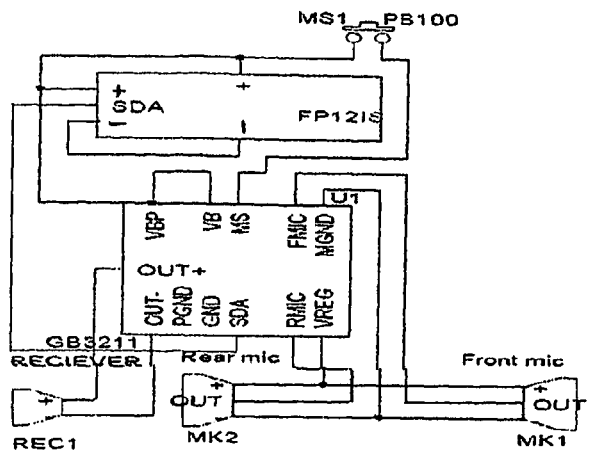
FIG. 4B is a circuit diagram showing the first embodiment of the PCB shown in FIG. 4A.
Figure 4C:
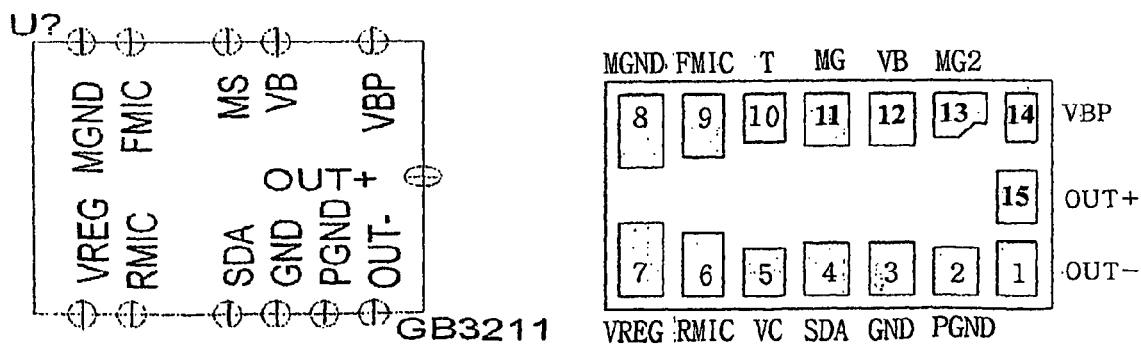
FIG. 4C shows a symbol diagram (left-side) for amplifier chip terminals and a layout (right-side) of the amplifier chip terminals of FIG. 4B.
Figure 4D:
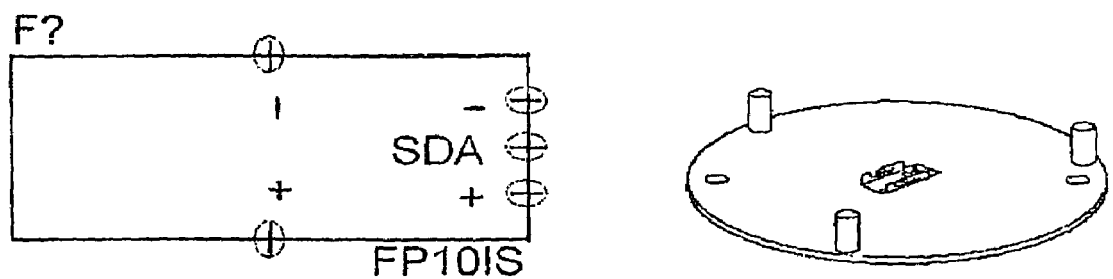
FIG. 4D shows a symbol diagram (left-side) for a battery chamber and a pictorial view (right-side) of the faceplate of FIG. 4B.
Figure 4E:
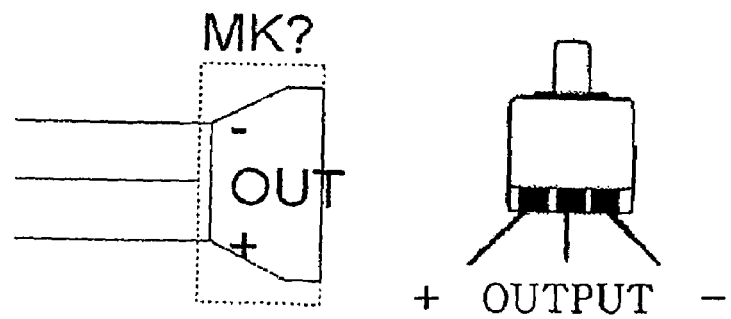
FIG. 4E shows a symbol diagram (left-side) for a microphone and a pictorial view (right-side) of the microphone of FIG. 4B.
Figure 4F:
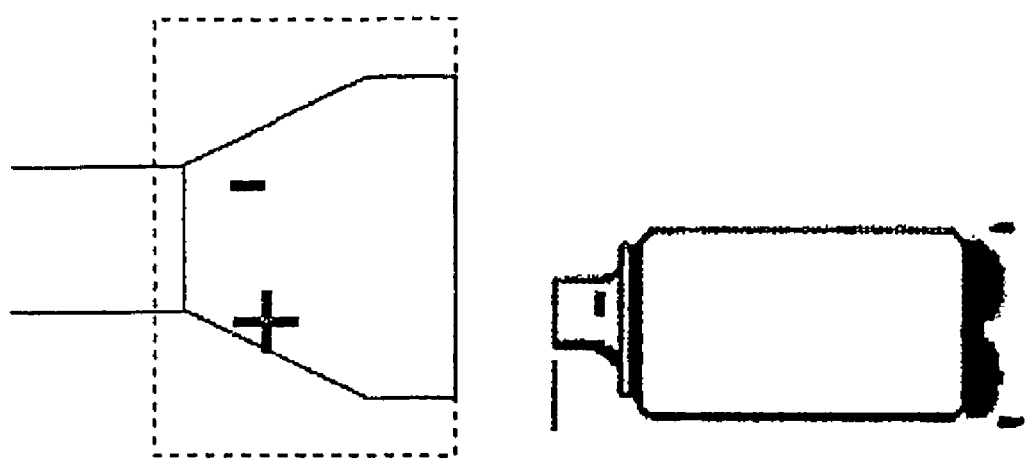
FIG. 4F shows a symbol diagram (left-side) for a receiver and a pictorial view (right-side) of the receiver of FIG. 4B.
Figure 4G:
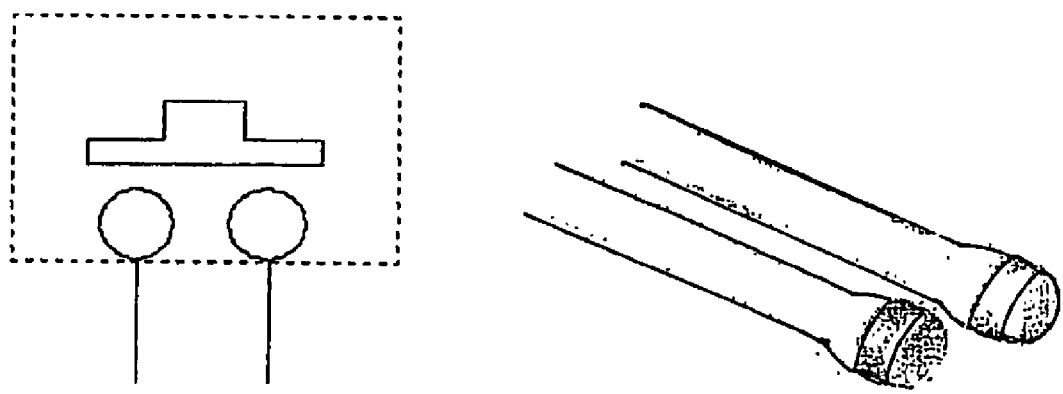
FIG. 4G shows a symbol diagram (left-side) for a memory diverting switch and a pictorial view (right-side) of the memory diverting switch of FIG. 4B.
Figure 5A:
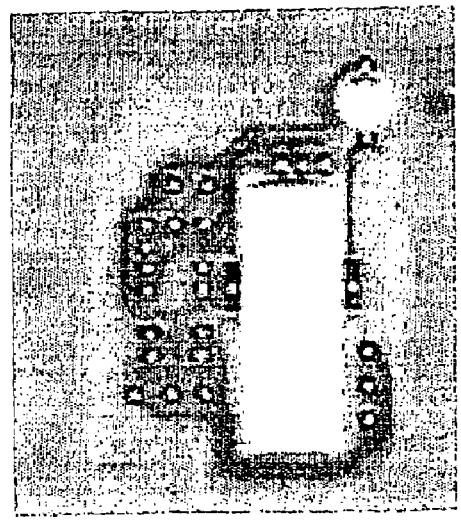
FIG. 5A is a photograph showing a second embodiment of a PCB which is mounted in the digital hearing aid faceplate.
Figure 5B:
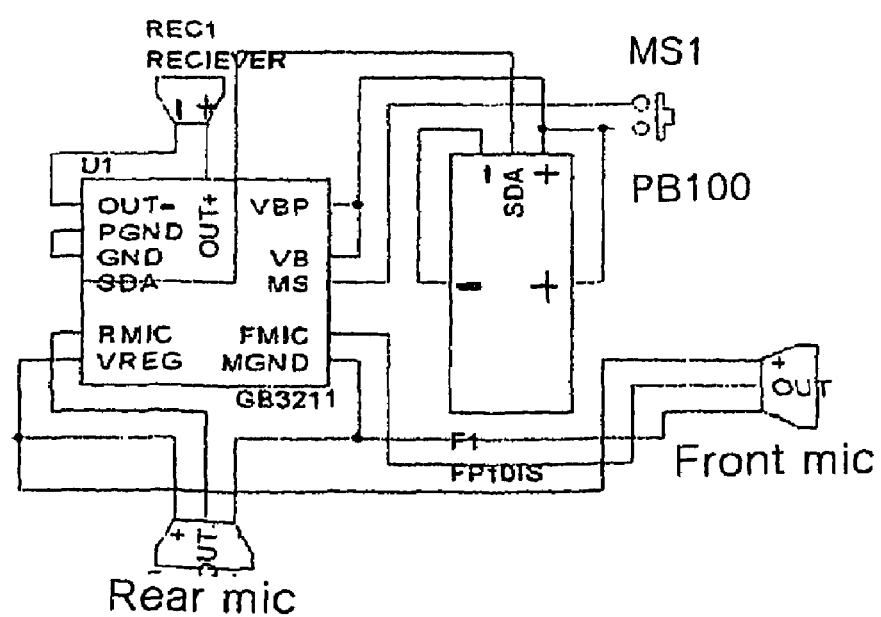
FIG. 5B is a circuit diagram showing the second embodiment of the PCB shown in FIG. 5A.

FIG. 4A is a photograph showing a first embodiment of a PCB which is mounted in the digital hearing aid faceplate. FIG. 4B is a circuit diagram showing the first embodiment of the PCB shown in FIG. 4A. FIG. 4C shows a symbol diagram (left-side) for amplifier chip terminals and a layout (right-side) of the amplifier chip terminals of FIG. 4B. FIG. 4D shows a symbol diagram (left-side) for a battery chamber and a pictorial view (right-side) of the faceplate of FIG. 4B. FIG. 4E shows a symbol diagram (left-side) for a microphone and a pictorial view (right-side) of the microphone of FIG. 4B. FIG. 4F shows a symbol diagram (left-side) for a receiver and a pictorial view (right-side) of the receiver of FIG. 4B. FIG. 4G shows a symbol diagram (left-side) for a memory diverting switch and a pictorial view (right-side) of the memory diverting switch of FIG. 4B. FIG. 5A is a photograph showing a second embodiment of a PCB which is mounted in the digital hearing aid faceplate. FIG. 5B is a circuit diagram showing the second embodiment of the PCB shown in FIG. 5A.

As shown in FIGS. 4A through 4G and FIGS. 5A and 5B, PCBs (Printed Circuit Boards) according to first and second embodiments of the present invention are designed and fabricated taking the layout of hearing aid components of FIG. 2A and the battery electrode terminals of FIG. 3 into consideration.

Figure 6:
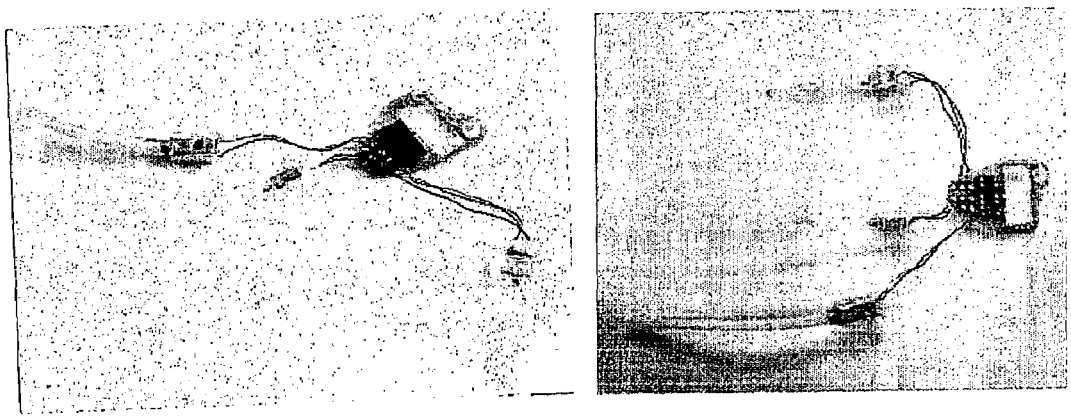
FIG. 6 shows photographs showing the upper surface and the lower surface of the PCB according to the first embodiment of the present invention, in which an amplifier, a front microphone, a rear microphone, and a receiver are soldered by an elongate electric wire.

FIG. 6 shows photographs showing the upper surface and the lower surface of the PCB according to the first embodiment of the present invention, in which an amplifier, a front microphone, a rear microphone, and a receiver are soldered by an elongate electric wire.

Now, a soldering order will be described below. First, an amplifier is soldered by a hot wind onto a PCB upside down. This soldering process is performed by an automatic soldering process on the PCB. In the case of the existing process of manufacturing a hearing aid faceplate, this soldering process is a process consuming much time. However, since the present invention adopts a PCB to which an automatic soldering process can be applied, a total processing time is remarkably shortened.

Then, front and rear microphones are soldered and connected onto PCB circuit terminals which have been indicated in advance on the PCB by use of electric wires.

Then, likewise, a receiver is soldered and connected onto PCB circuit terminals which have been indicated in advance on the PCB by use of electric wires.

Then, as shown in FIGS. 4A and 5A, holes through which the front and rear microphones and a memory diverting switch are inserted are all perforated on a faceplate on which the PCB will be attached. A memory diverting switch hole has been also fabricated on the PCB in designing the PCB.

Figure 7:
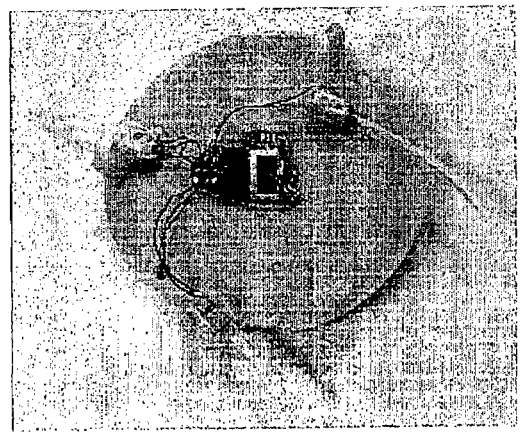
FIG. 7 is a photograph of the hearing aid according to the present invention in which a PCB on which hearing aid components of FIG. 6 are bonded on the faceplate and then a memory diverting switch is also mounted and soldered on the faceplate.

As shown in FIG. 7, the PCB on which hearing aid components of FIG. 6 are bonded on the faceplate by means of an adhesive.

Then, the front and rear microphones are inserted into the holes perforated on the faceplate and fixed thereon by means of an adhesive. The memory diverting switch is also inserted to pass through both the holes perforated on the PCB and the faceplate and then fixed thereto by means of an adhesive.

Then, the memory diverting switch terminals are soldered and connected onto PCB circuit terminals which have been indicated in advance on the PCB by use of short electric wires.

Then, the battery electrode terminals disposed at the center of the faceplate and the PCB circuit terminals are soldered and connected onto each other by use of short electric wires.

Finally, the interface socket terminals between an external controller attached to the battery chamber and the amplifier chip and the PCB circuit terminals are soldered and connected onto each other by use of short electric wires.

Figure 8A:
FIG. 8A is a photograph showing an interface electric wire is connected with an interface socket which is located in a battery chamber on the digital hearing aid faceplate of FIG. 7, for digital interface with an external control personal computer (PC)
Figure 8B:
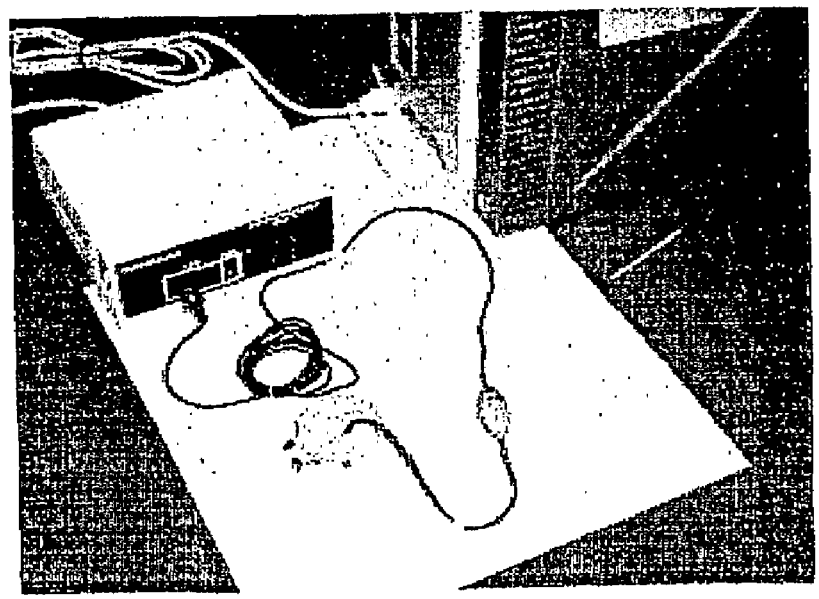
FIG. 8B is a photograph showing a digital interface between the digital hearing aid faceplate of FIG. 7 and the external control PC.

FIG. 8A is a photograph showing an interface electric wire is connected with an interface socket which is located in a battery chamber on the digital hearing aid faceplate of FIG. 7, for digital interface with an external control personal computer (PC) and FIG. 8B is a photograph showing a digital interface between the digital hearing aid faceplate of FIG. 7 and the external control PC.

As shown in FIGS. 8A and 8B, the interface electric wires are connected with the interface socket terminals disposed in the battery chamber of the fabricated faceplate of FIG. 7 in order to achieve digital interface with the external controller personal computer (PC), to then ascertain whether or not the digital amplifier chip operates normally.

As described above, a hearing aid using a printed circuit board (PCB) according to the present invention minimizes internal wires since components of the hearing aid are disposed on the PCB. That is, since individual soldering of amplifier terminals and components of the hearing aid in an existing hearing aid faceplate manufacturing process which consumes the longest time can be automatically performed on the PCB in which the hearing aid components are automatically soldered and disposed, the present invention provides an effect of remarkably shortening a total manufacturing process time.

INDUSTRIAL APPLICABILITY

As described above, the present invention provides a hearing aid employing a PCB (Printed Circuit Board) which can be applied in a medical equipment technological field, and which minimizes internal wires since components of the hearing aid are disposed on the PCB.

As described above, the present invention has been described with respect to particularly preferred embodiments. However, the present invention is not limited to the above embodiments, and it is possible for one who has an ordinary skill in the art to make various modifications and variations, without departing off the spirit of the present invention. Thus, the protective scope of the present invention is not defined within the detailed description thereof but is defined by the claims to be described later and the technical spirit of the present invention.

What is claimed is:

1. A hearing aid comprising:

a PCB (Printed Circuit Board) in which components of the hearing aid are automatically disposed and soldered;

a faceplate for use in the hearing aid; and battery electrode terminals connecting two positive and negative electrodes at both sides of a battery chamber disposed at the center of the faceplate, wherein the PCB is connected with the internal surface of the hearing aid faceplate by an adhesive, wherein an amplifier, a front microphone, a rear microphone, and a receiver are soldered in turn onto the PCB by an elongate electric wire, respectively, wherein a memory diverting switch and the battery electrode terminals are soldered and connected onto corresponding circuit terminals of the PCB, respectively, wherein interface socket terminals between an external controller attached to the battery chamber and the amplifier are soldered and connected onto corresponding circuit terminals of the PCB by use of short electric wires, and wherein an interface electric wire is connected with an interface socket located in the battery chamber on the faceplate for digital interface with the external controller to ascertain whether or not the amplifier operates normally.

* * * * *